United States Patent [19]

Ikeda

[11] Patent Number: 5,670,795

[45] Date of Patent: Sep. 23, 1997

[54] THIN-FILM TRANSISTOR ARRAY FOR DISPLAY

[75] Inventor: Hiroyuki Ikeda, Kanagawa, Japan

[73] Assignee: Sony Corporation, Japan

[21] Appl. No.: 442,311

[22] Filed: May 16, 1995

[30] Foreign Application Priority Data

May 20, 1994 [JP] Japan .................. 6-131246

[51] Int. Cl.⁶ .................. H01L 29/76; H01L 29/04
[52] U.S. Cl. .................. 257/72; 257/66
[58] Field of Search .................. 257/66, 72

[56] References Cited

U.S. PATENT DOCUMENTS

| 5,283,566 | 2/1994 | Mimura et al. | 345/211 |
| 5,438,241 | 8/1995 | Zavracky et al. | 315/169.3 |
| 5,444,557 | 8/1995 | Spitzer et al. | 359/59 |
| 5,475,514 | 12/1995 | Salerno et al. | 359/41 |

FOREIGN PATENT DOCUMENTS

| 0365036 | 4/1990 | European Pat. Off. . |
| 0372356 | 6/1990 | European Pat. Off. . |
| 0457328 | 11/1991 | European Pat. Off. . |
| 59-100415 | 6/1984 | Japan . |
| 2-85826 | 3/1990 | Japan . |
| 4309928 | 2/1992 | Japan . |

*Primary Examiner*—Mahshid D. Saadat
*Assistant Examiner*—Valencia Martin Wallace
*Attorney, Agent, or Firm*—Ronald P. Kananen

[57] ABSTRACT

A thin-film transistor array for display comprises a substrate and an interconnection layer, a plurality of pixel electrodes and thin-film transistors are integrally formed on the substrate, the interconnection layer is patterned so as to connect individual thin-film transistors, and at least part of the interconnection layer is laminated with a conductive layer and a metal layer having a smaller resistive value than the conductive layer being overlaid on the conductive layer in such a manner that the conductive layer is of a sufficient layer thickness to ensure the physical continuity of the thin-film pattern and the metal layer contributes to the lowering of the line surface resistance and is overlaid thinly enough to prevent the occurrence of surface variations such as hillocks.

11 Claims, 6 Drawing Sheets

THIN-FILM TRANSISTOR ARRAY FOR DISPLAY

BACKGROUND OF THE INVENTION

1. Field of the Invention

The present invention relates to a thin-film transistor array for display, and more particularly to low resistance line technology used for connecting individual thin-film transistors.

2. Description of Related Art

Display element thin-film transistors are integrally formed of pixel electrodes and thin-film transistors, with lines connecting individual thin-film transistors being formed in a certain pattern. A typical structure of a display element thin-film transistor will now be briefly described with reference to FIG. 7. FIG. 7 is a schematic cross-sectional view showing the structure of a thin-film transistor of pixel electrode as a switching element. As shown in the drawing, a thin film transistor 102 is formed on the surface of an insulation substrate 101, and a storage capacitor 103 adjacent to the thin-film transistor is formed on the substrate 101. The thin film transistor 102 has, as an element region, a semiconductor thin film 104 patterned in an island shape and a gate line 106 is formed in a certain pattern. An auxiliary line 107 is also formed in a certain pattern as one of the electrodes of the storage capacitor 103.

Technology for finer-detailed picture elements is essential in order to achieve more beautiful and natural picture quality. If the number of pixel electrodes arranged in a matrix shape is substantially increased, which goes hand-in-hand with improvements in fine detail, the number of switching elements running along the horizontal and vertical directions is also increased. In this case, the resistance of the line used to connect the thin-film transistors which make up the switching elements, along with transistor capacitances and parasitic capacitances, cause the time constant to be integrated, and delays in writing image signals to each of the pixel electrodes cannot be ignored. Increases in the line resistance are particularly detrimental.

Conventionally, in the case of thin-film transistor arrays made using high-temperature processes including thermal oxidation etc., a semiconductor thin-film (DOPOS) which has it's resistance reduced by impurity dispersion is usually used as the gate line material. Methods where the impurity concentration is raised or the thin film is made thick have been adopted in order to lower the resistance value of the impurity semiconductor thin-film, although this approach proved to be somewhat limited. Generally, the sheet resistance of a resistance-lowered semiconductor thin film is 20 to 30 $\Omega/\square$ width in the case of, for example, a DOPOS.

There are also methods of lowering the resistance value by taking a combination of a semiconductor thin-film and a metal silicide, or just a metal silicide, as the line. The sheet resistance of metal silicide is, for example, about 1/10 of DOPOS in the case of $TiSi_2$. However, high-temperature thermal processes are necessary in order to lower the metal silicide sheet resistance to the original value. This is a major hindrance when making thin-film transistors on insulation substrates such as cheap, low melting point glass etc. using low-temperature processes.

It is also possible to form a gate line etc. by directly using a metal alone. However, when there is a high temperature thermal process involved in the manufacturing process, the metal line pollutes the gate insulation layer causing the electrical characteristics of the thin-film transistor to fluctuate, which is detrimental to long-term reliability. Also, in the case of low temperature process manufacturing, aluminum is advantageous as the line material as it has the lowest sheet resistance. The sheet resistance of aluminum is about 1/10 that of metal silicide $TiSi_2$. For example, the sheet resistance is about 1 $m\Omega/\square$ width for a layer thickness of 40 nm and about 100 $m\Omega/\square$ width for a layer thickness of 100 nm. However, it is necessary to form the aluminum to a layer thickness suitable for preventing, for example, discontinuities, and maintaining the desired workability. In this case, even if a comparatively low temperature process of about 300° C. is included as a post-process, problems such as the occurrence of so-called hillocks and short-circuit defects still occur. Hillocks are convex-type defects which grow out from the surface of the aluminum in pin-shapes. Technology for performing positive electrode oxidization on these surfaces in order to prevent hillocks have been proposed, as disclosed, for example, in Japanese Laid-Open Patent Publication No. Hei. 2-85826. However, additional processes are necessary to perform positive gate electrode oxidization on the surface of the aluminum gate line.

SUMMARY OF THE INVENTION

As the present invention sets out to resolve the problems encountered in the prior art, it is an object of the present invention to provide a thin-film transistor array which makes a high-definition high picture quality display a possible by lowering line resistance.

In order to achieve this object, a thin-film transistor array for display comprises a substrate and an interconnection layer. A plurality of pixel electrodes and thin-film transistors are integrally formed on the substrate and the interconnection layer is patterned so as to connect individual thin-film transistors. At least part of the interconnection layer is laminated with a conductive layer and a metal layer having a smaller resistance value than the conductive layer being overlaid on the conductive layer.

In order to achieve this object, the conductive layer may be comprised of a semiconductor layer doped with impurities or comprised of a metal, and may be patterned continuously along the conductive layer thereunder or in a discontinuous manner along the conductive layer thereunder.

In order to achieve this object, the metal layer may be comprised of a metal film which is 200 nm or less in thickness and composed mainly of aluminum. The metal layer may alternatively be a single metal film comprising a material selected from molybdenum, titanium, tungsten, chrome, nickel, tantalum or an alloy thereof, having a thickness of 300 nm or less, or a multiple metal film comprising of a plurality of materials selected from aluminum, molybdenum, titanium, tungsten, chrome, nickel, tantalum or an alloy thereof.

In order to achieve this object, the thin-film transistor array according to the present invention may further comprise a display part including switching elements connected to the pixel electrodes and a peripheral part including a drive circuit arranged therein, with the switching elements and the drive circuits being comprised of the thin film transistors.

In order to achieve this object, a thin-film element array line for connecting thin-film elements integrally formed on an insulation substrate may comprise a conductive layer and a metal layer. The conductive layer may have a layer thickness sufficient for ensuring physical continuity as a thin-line pattern and the metal layer may be laminated on the conductive layer thinly enough to cause no surface variations in the thin line pattern, with a smaller resistance value and thickness than the conductive layer.

In order to achieve this object, the conductive layer may be comprised of an impurity-doped semiconductor film and the metal layer may be comprised of a metal film composed mainly of aluminum.

Lastly, in order to achieve this object, a liquid crystal display apparatus may be comprised of a pair of opposing substrates, a liquid crystal layer, pixel electrodes and thin-film transistors, opposing electrodes, and an interconnection layer. The pair of opposing substrates are interposed with a prescribed gap. The liquid crystal layer is held in the gap. The pixel electrodes and thin-film transistors are integrally formed on one of the substrates. The opposing electrodes are formed on the other substrate. The interconnection layer is patterned for connecting individual thin-film transistors. At least part of the interconnection layer is laminated with a conductive layer and a metal layer having a smaller resistance value than a conductive layer being overlaid on the conductive layer.

According to the present invention, in order to connect thin-film elements such as thin-film transistors integrally formed on an insulation substrate, a line having a new structure is formed as a thin-line pattern on the same insulation substrate. This line has a laminated structure whereby a conductive layer and a metal layer having a smaller layer thickness and resistive value than the conductive layer are overlaid in order. The lower side conductive layer is comprised of an impurity-doped semiconductor layer and the upper side metal layer is comprised of a metal film having aluminum as it's main constituent. The lower side conductive layer has a thickness sufficient to ensure that the physical continuity of the layer as the thin-line pattern is maintained. On the other hand, the upper side metal layer contributes to the reduction of the surface resistance of the laminated structure and is overlaid to a sufficient degree of thinness to ensure that surface variations of the thin-line pattern do not occur. For example, it is possible to dramatically reduce the line surface resistance by forming an extremely thin layer of aluminum as the upper side aluminum layer, and there is no fear of hillocks occurring. It is by no means necessary to form the metal layer continuously along the lower side conductive layer in order to reduce the surface resistance. It is possible to substantially reduce surface resistance even with non-continuous metal layer. In particular, in the case where a metal layer comprised of, for example, aluminum is divided so as to be non-continuous, the Generation of hillocks can be effectively suppressed.

DETAILED DESCRIPTION OF THE PREFERRED EMBODIMENTS

First Embodiment

Figure 1:
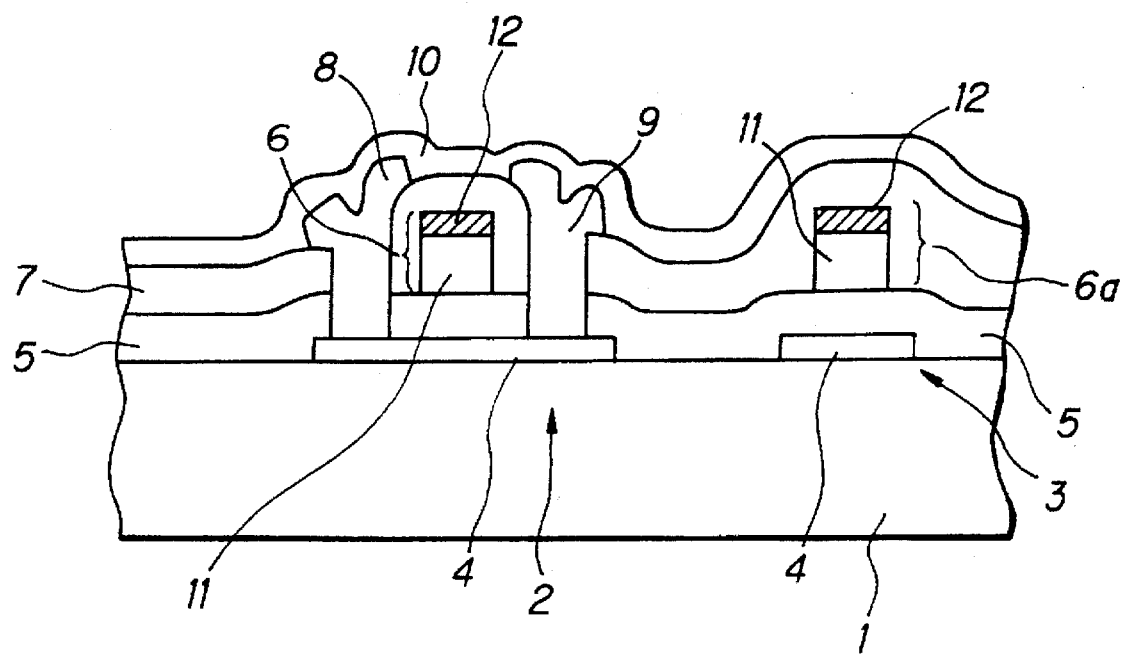
FIG. 1 is a schematic cross-sectional view showing a first embodiment of a thin-film transistor array for display of present invention.

The following is a detailed description, with reference to the diagrams, of a suitable embodiment of the present invention. FIG. 1 is a schematic cross-sectional drawing showing a first embodiment of a thin-film transistor array for a display element of the present invention. In this example, a planar thin-film transistor is taken as the subject. A thin-film transistor (TFT) 2 and a storage capacitor (Cs) 3 are integrally formed on an insulating substrate 1. The transistor 2 is taken as an element region of the semiconductor thin-film 4 patterned into an island shape, on top of which a gate line 6 is patterned via a gate insulation layer 5. The thin-film transistor 2 having this construction is coated with an inter-layer insulation film 7, on top of which a source line 8 and drain line 9 is patterned. The source line 8 is connected to a signal line (not shown in FIG. 4) and the drain line 9 is connected to pixel electrodes (not shown in FIG. 4). The source line 8 and the drain line 9 are coated with a passivation film 10. The semiconductor thin-film 4 is patterned to a prescribed shape and taken as the electrode of one side of the storage capacitor 3 and the auxiliary line 6a is taken as the electrode of the other side via the gate insulation film 5. The auxiliary line 6a has the same layer structure as the gate line 6.

A characteristic of the present invention is that interconnecting layers such as the gate line 6 and the auxiliary line 6a have a laminated structure whereby a metal layer 12 having a lower resistive value than a conductive layer 11 is overlaid on the conductive layer 11. The conductive layer 11 is a thin line pattern of sufficient thickness to ensure physical continuity. One side of the metal layer 12 contributes to reducing the surface resistance of the laminated structure and is thinly overlaid to an extent that thin-line pattern surface variations (for example, hillocks) do not occur. In this example, the conductive layer 11 is comprised of a semiconductor (for example, DOPOS) which has had it's resistance lowered using impurity-doping. The metal layer 12 is therefore comprised of a metal film, of which the main constituent is aluminum, preferably having a thickness of 200 nm or less. Alternatively, the metal layer 12 may be a single metal layer comprised of a material selected from molybdenum, titanium, tungsten, chrome, nickel, tantalum or an alloy thereof, with a thickness set at 300 nm or less being preferable. A large variety of metal films comprised of a plurality of materials selected from aluminum, molybdenum, titanium, tungsten, chrome, nickel, tantalum or an alloy thereof may be used for the metal layer 12.

Figure 2:
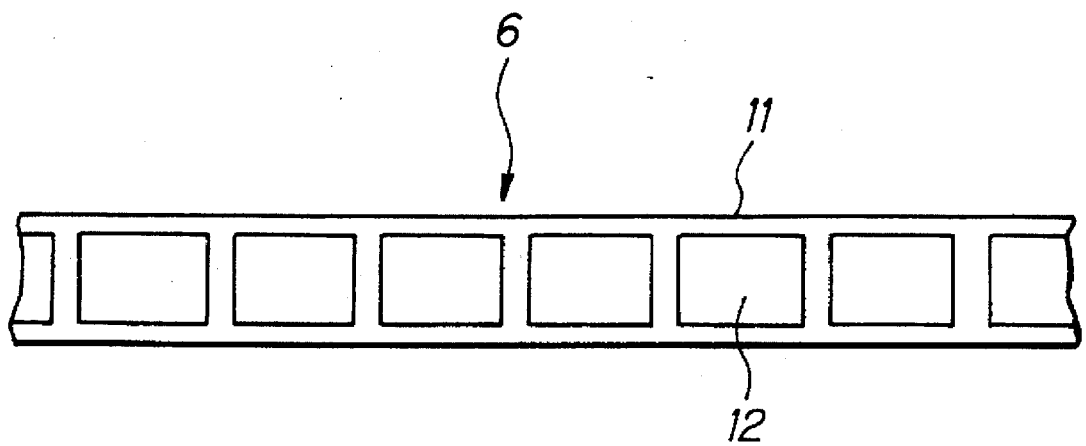
FIG. 2 is a plane view showing an line pattern example employing the first embodiment.
Figure 3:
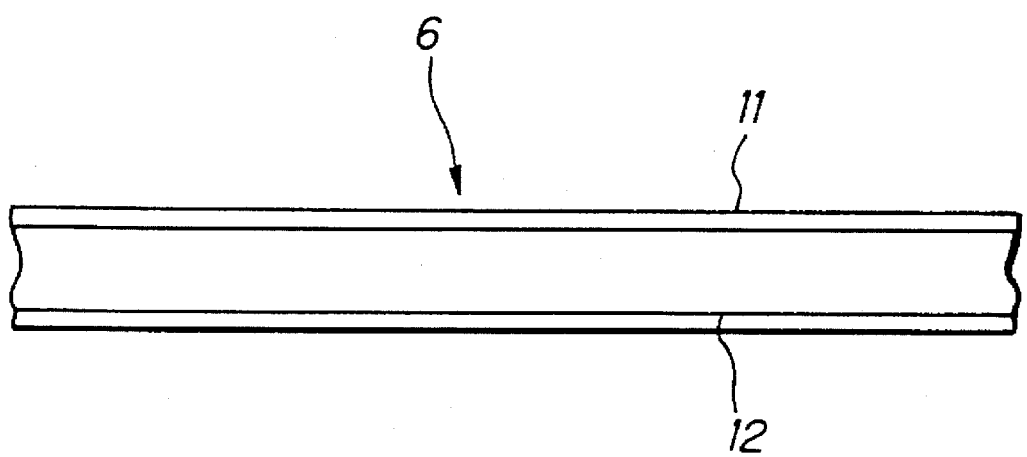
FIG. 3 is a plane view showing a further pattern example for the same line.

The plane shape of the gate line 6 is shown with reference to FIG. 2. The lower side conductive film 11 has a continuous thin line pattern, while the upper side metal layer 12 has a discontinuous pattern which runs along the conductive layer 12. As the object of the metal layer 12 is to lower the surface resistance of the line 6, there is no need for this metal layer 12 to have a continuous pattern. As shown in the same diagram, a marked decrease in the surface resistance can be achieved even with a discontinuous pattern. Particularly, when aluminum is used as the metal layer 12, hillocks can be effectively controlled by division. On the other hand, FIG. 3 shows a further example of the line 6. The upper side metal layer 12 is formed as a continuous pattern along the lower side conductive layer 11.

The specific manufacturing method of the thin-film transistor array for display of the present invention will now be described in detail by returning to FIG. 1. First, a semiconductor thin-film 4 comprised of polycrystalline silicon is formed at a temperature of 600° C. to a thickness of, for example, 100 nm on an insulation layer comprised of, for example, quartz glass. After this, ion injection is carried out for threshold adjustment and the semiconductor thin-film 4 is patterned into an island shape. Next, a silicon oxide layer is formed as the gate insulation layer 5. After this, a polycrystalline silicon thin-film is formed, and a DOPOS is provided by carrying out vapor phase impurity doping and is taken as the first layer of the gate line 6 and the auxiliary line 6a. Impurity ions are then implanted into the semiconductor thin-film layer 4 using self alignment, taking the DOPOS which has been patterned into a prescribed shape as a mask, and activation is carried out. After a layer of aluminum has been formed to a thickness of 70 nm as the metal layer 12, patterning is carried out and the gate line 6 and auxiliary line 6a which are laminated in structure are manufactured. After this, an inter-layer insulation film 7 is formed and the source line 8, drain line 9 and the passivation film 10 are formed, so that the thin-film transistor array for display is completed.

Figure 7:
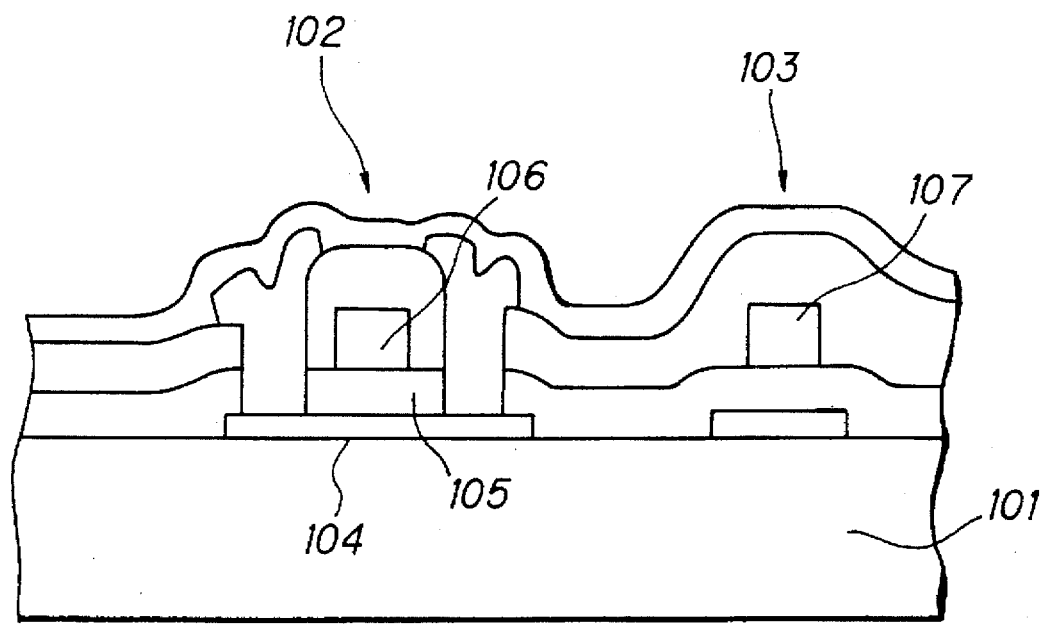
FIG. 7 is a schematic cross-sectional view showing an example of a display thin-film transistor array.

The sheet resistance of gate lines made in this way was measured to be about 1 Ω/□ width. The sheet resistance of the gate line 106 shown in FIG. 7 is therefore 40 Ω/□. Therefore, according to the present invention it is possible to dramatically reduce the line resistance. Usually, with high-temperature process thin-film transistors, polycide or silicide is employed to lower the gate line resistance. However, in this embodiment, in order to avoid using these materials and dramatically lower the resistance, a laminated structure is adopted where extremely thin aluminum is overlaid on the DOPOS. Assuming the case where aluminum alone is used for the gate line, a thickness equal to or greater than a fixed thickness would be necessary and hillocks are generated even with low temperature annealing at a temperature of, for example, 400° C. The DOPOS is coated with an ultra-thin aluminum film. Usually, when aluminum alone is used for the gate line, a thickness of 500 nm of greater is necessary. The aluminum layer thickness is therefore set at 200 nm or less in the present invention. Making the layer thin is effective for preventing hillocks, and in reality, about 50 nm is appropriate. Forming films of 10 nm or less is difficult. On the other hand, it is not necessary to make the thickness of the aluminum film more than is necessary in order to reduce the surface resistance and saturation of the effect of lowering the surface resistance starts in practical terms at a thickness of about 100 nm.

With the gate line 6 of the structure shown in FIG. 1, the metal layer 12 is by no means limited to a single-layer film of metal. For example, a multiple-metal film where an aluminum film is formed to a thickness of 40 nm on a semiconductor 11 comprised of a DOPOS, and a titanium film is then formed to a thickness of 50 nm as a second metal layer may also be used. Alternatively, a titanium film barrier formed to a thickness of about 50 nm on the DOPOS with an extremely thin aluminum film formed on top is also possible.

Second Embodiment

Next, a second embodiment of a thin-film transistor array for the present invention will be described in detail with reference to FIG. 4. In this example, a reverse-staggered type thin-film transistor is taken as the subject. A reverse-staggered type thin-film transistor is formed on an insulation substrate 21, as shown in the same drawing. The thin-film transistor 22 is formed from a semiconductor thin-film 25 which is formed in a certain pattern on top of a gate line 23 and a gate line layer 24. Stopper insulation 26 is then formed on top of the semiconductor thin-film 25, with a source line 27 and drain line 28 then being formed on either side of the stopper insulator 26 in a certain pattern. The thin-film transistor 22 having this structure is then coated with a passivation film 29. An auxiliary line 23a is also formed in a certain pattern on the surface of the insulation substrate 21 at the same time as the gate line 23.

The characteristic item of the present invention is that the gate line 23 and the auxiliary line 23a have a conductive layer 30 and a metal layer 31 having a smaller resistance value than the conductive layer 30 overlaid as a laminated structure. In this example, the lower side conductive layer 30 is constructed of an impurity semiconductor or a metal. In the case of a metal, a selection can be made from, for example, molybdenum, tantalum, titanium or chrome etc. On the other hand, the upper side metal layer 31 can be formed as an ultra-thin aluminum film (for example, less than 100 nm). In addition to this, it is also possible to use a material selected from molybdenum, titanium, tungsten, chrome, nickel, tantalum or an alloy thereof as the upper side metal layer. However, an essential feature of the present invention is that the upper side metal layer is set to be of a smaller resistance value and of a thinner film thickness with respect to the conductive layer comprised of the lower side metal.

Figure 4:
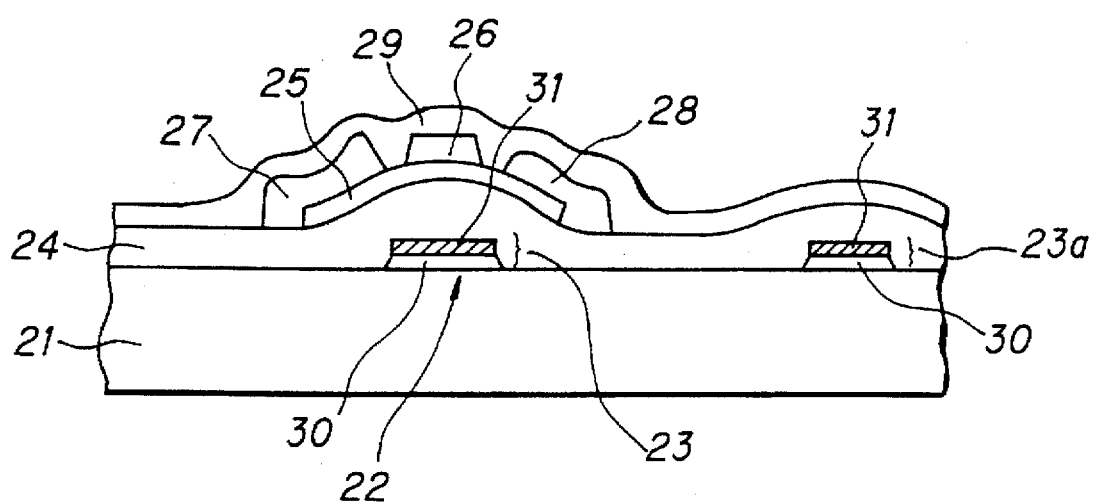
FIG. 4 is a schematic cross-sectional view showing a second embodiment of a display element thin-film transistor array of the present invention.

A specific description of the manufacturing method for the second embodiment is now described with continued reference to FIG. 4. A low resistance 100 nm amorphous silicon thin-film is formed as the lower side conductive layer 30 on the insulation substrate 21 comprised of a low melting point glass etc. using plasma CVD techniques employing phosphine gas ($PH_3$) and silane gas ($SiH_4$) as the basic raw materials. An aluminum film 50 nm thick is formed on top of this using sputtering, patterned into a prescribed shape and taken as the upper side metal layer 31. In this way, a gate line 23 and auxiliary line 23a having a laminated structure is obtained. Next, a gate insulation layer 24 is formed using atmospheric pressure CVD techniques, on top of which an amorphous silicon layer is formed as the semiconductor thin film 25. After patterning this into an island shape, stopper insulator 26 is formed on top of the semiconductor thin film 25. Impurities are implanted into the source region and the drain region using an ion shower and the source line 27 and drain line 28 are formed in certain patterns. Finally, the passivation layer 29 is coated-on and the display element thin-film array is complete. The sheet resistance of the gate line 23 and the auxiliary line 23a obtained in this way is then 0.8 Ω/□ width.

A separate manufacturing method for the second embodiment shown in FIG. 4 will now be described. First, a titanium film is formed to a thickness of 200 nm using sputtering on the insulation substrate 21 comprised of, for example, glass and patterning into a prescribed shape is carried out so as to give the lower side conductive layer 30. Next, an aluminum film is similarly formed to a thickness of 50 nm as the upper side metal layer 31 and the gate line 23 and the auxiliary line 23a are then obtained. In this example, patterning is carried out so that aluminum does not remain at the portion overlapping with the channel region of the thin-film transistor 22. The gate insulation layer 24 and the semiconductor thin-film 25 comprised of amorphous silicon are then formed and the amorphous silicon layer is crystallized via laser irradiation. Next, the stopper insulator 26 is formed, masked, and the source line 27 and drain line 28 are formed after impurities have been introduced using self-alignment. Further, pixel electrodes which are electrically connected to the drain line 28 are formed by, for example, ITO, although this is not shown in the drawings. In this example, the gate line 23 has a sheet resistance of 1.5 Ω/□ width.

Figure 5:
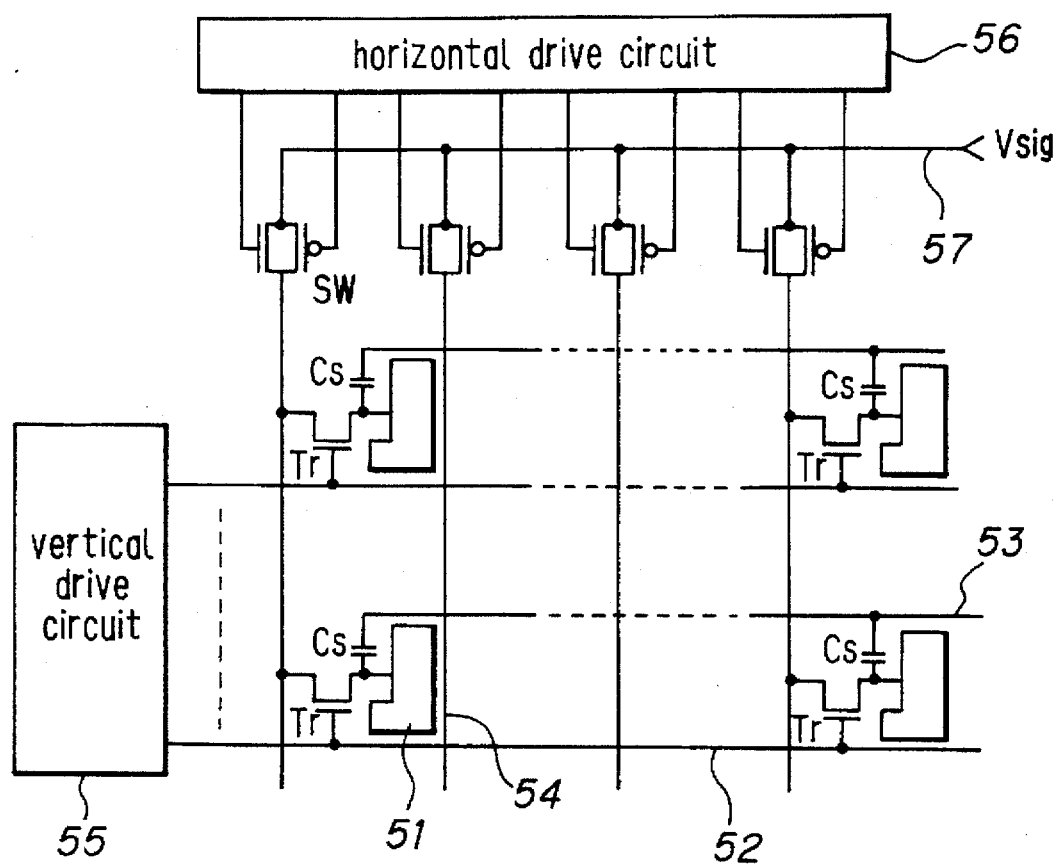
FIG. 5 is a block diagram showing the overall structure of the display element thin-film transistor array of the present invention.

FIG. 5 is a schematic plane view showing the overall structure of the thin-film transistor array of the present invention. As shown in FIG. 5, the thin-film transistor array is equipped with pixel electrodes 51 arranged in a matrix shape. Thin-film transistors Tr and storage capacitors Cs corresponding to individual pixel elements 51 are integrally formed. The specific structure of these thin-film transistors and storage capacitors are as shown in FIG. 1 through 4. The region where the pixel electrodes 51 and the switching element thin-film transistors Tr etc. are integrally formed becomes the thin-film transistor array display part. This display part is formed in a certain pattern from a line-shaped gate line 52 and auxiliary line 53 of the same line-shape, and a column-shaped signal line 54. As described previously, the gate line 52 and the auxiliary line 53 are a conductive layer, and a metal layer which has a smaller resistance value than the conductive layer, which are overlaid so as to give a laminated structure.

This display element thin-film transistor is integrally formed together with a peripheral part including a vertical drive circuit 55 and a horizontal drive circuit 56. These drive circuits are also constituted by thin-film transistors. A laminated structure whereby a conductive layer, and a metal layer of a smaller resistive value than the conductive layer, are overlaid is also adopted for the interconnecting layer for connecting individual thin-film transistors in accordance with the present invention. The vertical drive circuit 55 is connected to the gate line 52. On the other hand, the horizontal drive circuit 56 controls the opening and closing of analog switches SW provided at the end of each signal line 54. An image signal Vsig is provided to this analog switch SW via a video line 57.

Figure 6:
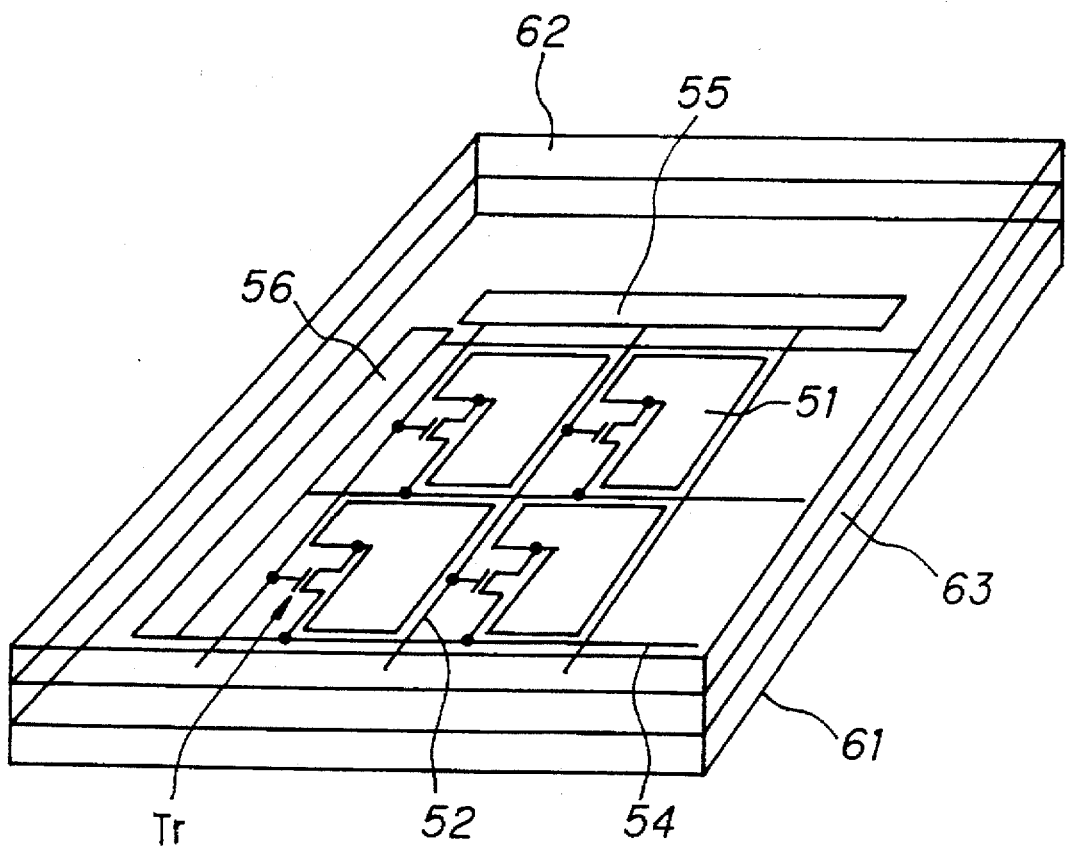
FIG. 6 is a schematic perspective view showing an example of an assembled liquid crystal display apparatus employing the display element thin-film transistor array element of the present invention.

Finally, an example of an assembled liquid crystal apparatus employing the thin-film transistor array of the present invention is shown with reference to FIG. 6. As shown in the drawing, the liquid crystal display device has a panel structure including a pair of opposing insulation substrates 61 and 62, interposed by a prescribed gap, and a liquid crystal layer 63 which maintains this gap. The lower side insulation substrate 61 is comprised of the thin-film transistor array of the present invention, with thin-film transistors Tr integrally formed as pixel electrodes 51 and switching elements. The gate line 52 and signal line 54 are also formed in a certain pattern. Further, a vertical scanning circuit 55 and a horizontal scanning circuit 56 are also integrally formed at the peripheral part. On the other hand, a pair of opposing electrodes are formed on the inner surface of the upper side substrate 62.

As described above, according to the present invention, a line of a laminated structure for connecting thin-film elements integrally formed on an insulation substrate is formed as a thin-film pattern. This line has a laminated structure whereby a conductive layer and a metal layer of a smaller layer thickness and resistance value than the conductive layer are overlaid in order. The conductive layer is of a sufficient thickness to ensure physical continuity of the thin-line pattern. The metal layer contributes to the lowering of the surface resistance of the laminated structure and is overlaid so as to be thin enough to ensure that surface variations do not occur in the thin-line pattern. With this structure, detriments to the reliability of the display element thin-film transistor array are not incurred and even if a low temperature process is used instead of a high temperature process, a line of a sufficiently low resistive value can be formed.

What is claimed is:

1. A thin-film transistor array for displaying comprising:
   a plurality of pixel electrodes and thin-film transistors integrally formed on a substrate; and
   an interconnection layer patterned for connecting individual thin-film transistors, wherein at least part of the interconnection layer is laminated with a conductive layer and a metal layer, wherein said metal layer has a lower resistance value than does said conductive layer and wherein said metal layer is overlaid on said conductive layer, and
   wherein the metal layer comprises a metal film 200 nm or less thick composed mainly of aluminum.

2. A thin-film transistor array for displaying comprising:
   a plurality of pixel electrodes and thin-film transistors integrally formed on a substrate; and
   an interconnection layer patterned for connecting individual thin-film transistors, wherein at least part of the interconnection layer is laminated with a conductive layer and a metal layer, wherein said metal layer has a lower resistance value than does said conductive layer and wherein said metal layer is overlaid on said conductive layer; and
   wherein the metal layer is a single metal film comprising a material selected from the group consisting of molybdenum, titanium, tungsten, chrome, nickel, tantalum and an alloy thereof, having a thickness of 300 nm or less.

3. A thin-film transistor array according to claim 1 or 2, wherein the conductive layer comprises a semiconductor layer doped with impurities.

4. A thin-film transistor array according to claim 1 or 2, wherein the metal layer is patterned continuously along the conductive layer thereunder.

5. A thin-film transistor array according to claim 1 or 2, wherein the metal layer is patterned discontinuously along the conductive layer thereunder.

6. A thin-film transistor array according to claim 1 or 2, further comprising a display part including switching elements connected to the pixel electrodes and a peripheral part including a drive circuit arranged therein, wherein the switching elements and the drive circuits are comprised of the thin film transistors.

7. A thin-film element array line for connecting thin-film elements integrally formed on an insulation substrate, comprising:
   a conductive layer having a layer thickness sufficient for ensuring physical continuity as a thin-line pattern; and
   a metal layer laminated on the conductive layer thinly enough to cause no surface variations in the thin line pattern, with a smaller resistance value and thickness than the conductive layer.

8. A thin-film element array line according to claim 7, wherein the conductive layer comprises an impurity-doped semiconductor film.

9. A thin-film element array line according to claim 7, wherein the metal layer comprises a metal film composed mainly of aluminum.

10. A liquid crystal display device comprising:
    a pair of opposing substrates interposed with a prescribed gap;

a liquid crystal layer held in the gap;

pixel electrodes and thin-film transistors integrally formed on one of the substrates;

opposing electrodes formed on the other substrate; and an interconnection layer patterned for connecting individual thin-film transistors, wherein at least part of the interconnection layer is laminated with a conductive layer and a metal layer, wherein said metal layer has a lower resistance value than does said conductive layer and wherein said metal layer is overlaid on said conductive layer; and wherein the metal layer comprises a metal film 200 nm or less thick composed mainly of aluminum.

11. A liquid crystal display device comprising:

a pair of opposing substrates interposed with a prescribed gap;

a liquid crystal layer held in the gap;

pixel electrodes and thin-film transistors integrally formed on one of the substrates;

opposing electrodes formed on the other substrate; and an interconnection layer patterned for connecting individual thin-film transistors, wherein at least part of the interconnection layer is laminated with a conductive layer and a metal layer, wherein said metal layer has a lower resistance value than does said conductive layer and wherein said metal layer is overlaid on said conductive layer; and wherein the metal layer is a single metal film comprising a material selected from the group consisting of molybdenum, titanium, tungsten, chrome, nickel, tantalum and an alloy thereof, having a thickness of 300 nm or less.

* * * * *